(12) United States Patent
Lee

(10) Patent No.: US 11,230,123 B2
(45) Date of Patent: *Jan. 25, 2022

(54) PRINTER FOR SECURITY PAPER

(71) Applicant: Myung Shin Lee, Gyeonggi-do (KR)

(72) Inventor: Myung Shin Lee, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/999,722

(22) Filed: Aug. 21, 2020

(65) Prior Publication Data

US 2021/0008899 A1 Jan. 14, 2021

Related U.S. Application Data

(63) Continuation of application No. 16/616,313, filed as application No. PCT/KR2018/005810 on May 23, 2018, now Pat. No. 10,787,006.

(51) Int. Cl.
*G06F 15/00* (2006.01)
*G06K 15/00* (2006.01)
(Continued)

(52) U.S. Cl.
CPC .............. *B41J 11/009* (2013.01); *B41M 3/14* (2013.01); *B42D 25/29* (2014.10); *G08B 21/18* (2013.01);
(Continued)

(58) Field of Classification Search
CPC ......... B41J 11/009; B42D 25/29; B41M 3/14; G08B 21/18; H05K 1/182; H05K 1/189
(Continued)

(56) References Cited

U.S. PATENT DOCUMENTS

2010/0165401 A1* 7/2010 Silverbrook ............. B41J 3/445
358/1.15
2011/0205281 A1 8/2011 Saita
(Continued)

FOREIGN PATENT DOCUMENTS

CN 1293623 A 5/2001
JP 2005-255358 9/2005
(Continued)

OTHER PUBLICATIONS

Office Action dated Jun. 21, 2020 in corresponding Korean Patent Application No. 10-2020-0006536.
(Continued)

*Primary Examiner* — Douglas Q Tran
(74) *Attorney, Agent, or Firm* — Mintz Levin Cohn Ferris Glovsky and Popeo, P.C.; Steven M. Jensen

(57) ABSTRACT

A printer for security paper, such as a multifunction printer, a printer, a facsimile machine or a copier, is configured to perform a printing operation by distinguishing between security paper and normal paper. The printer for security paper includes: a security paper sensor disposed on a printing paper feeding path; and a control unit for comparing a first sensing value sensed by the security paper sensor when printing paper to be determined is not present near the security paper sensor with one or more second sensing values sensed by the security paper sensor for the corresponding printing paper on the feeding path, during the course of conveying the corresponding printing paper on the feeding path, determining printing paper as security paper when a comparison value is above a predefined reference value, and determining printing paper as normal paper when the comparison value is below the predefined reference value.

8 Claims, 10 Drawing Sheets

(51) Int. Cl.
  *G06K 1/00* (2006.01)
  *B41J 11/00* (2006.01)
  *B42D 25/29* (2014.01)
  *B41M 3/14* (2006.01)
  *G08B 21/18* (2006.01)
  *H05K 1/18* (2006.01)
(52) U.S. Cl.
  CPC ............ *H05K 1/182* (2013.01); *H05K 1/189* (2013.01); *H05K 2201/10121* (2013.01); *H05K 2201/10151* (2013.01)
(58) Field of Classification Search
  USPC ............................... 358/1.15, 1.14, 1.13, 1.1
  See application file for complete search history.

(56) References Cited

U.S. PATENT DOCUMENTS

| | | |
|---|---|---|
| 2013/0258021 A1 | 10/2013 | Fuchioka et al. |
| 2016/0321526 A1 | 11/2016 | Kim et al. |
| 2017/0137241 A1* | 5/2017 | Okumura ................ B65H 1/02 |

FOREIGN PATENT DOCUMENTS

| | | |
|---|---|---|
| JP | 2011-150310 A | 8/2011 |
| KR | 10-2005-0005326 A | 1/2005 |
| KR | 10-2007-0112652 | 11/2007 |
| KR | 10-2012-0021207 | 3/2012 |
| KR | 10-1174078 | 8/2012 |
| KR | 10-2012-0116067 A | 10/2012 |
| KR | 10-2014-0125610 A | 4/2013 |
| KR | 10-1265900 | 5/2013 |
| KR | 10-2013-0020019 | 6/2013 |
| KR | 10-1278388 | 6/2013 |
| KR | 10-2016-0128519 | 12/2016 |
| KR | 10-1700166 | 1/2017 |
| KR | 10-2017-0033682 A | 3/2017 |

OTHER PUBLICATIONS

International Preliminary Report on Patentability dated Nov. 26, 2019 in corresponding PCT Application No. PCT/KR2018/005810.
International Search Report dated Sep. 14, 2018 in corresponding International Patent Application No. PCT/KR2008/005810.
Office Action (Notice of Grounds for Rejection) dated Aug. 30, 2018 in corresponding Korean Patent Application No. 10-2017-0107167.
Office Action (Notice of Grounds for Rejection) dated Aug. 30, 2018 in corresponding Korean Patent Application No. 10-2017-0107168.
Taiwanese Office Action dated Sep. 9, 2021 in corresponding Application No. 107117545.
Taiwanese Office Action dated Sep. 9, 2021 in corresponding Application No. 107117516.
Office Action (Decision for Grant of Patent) dated Oct. 18, 2021 in corresponding Application No. 10-2020-0045463.

* cited by examiner

PRINTER FOR SECURITY PAPER

CROSS-REFERENCE TO RELATED APPLICATION(S)

This application is a continuation of copending application U.S. Ser. No. 16/616,313, filed on Nov. 22, 2019, which is a U.S. National Phase of International Application No. PCT/KR2018/005810 with an International Filing Date of May 23, 2018, which claims under 35 U.S.C. § 119(a) the benefit of Korean Application No. 10-2017-0107168 filed on Aug. 24, 2017, Korean Application No. 10-2017-0107167 filed on Aug. 24, 2017, and Korean Application No. 10-2017-0063370 filed on May 23, 2017, the entire contents of which are incorporated herein by reference.

TECHNICAL FIELD

The present invention relates to a printer for security paper, and more particularly, to a multifunction printer, a printer, a facsimile machine and a copier configured to perform a printing operation by distinguishing between security paper and normal paper. In the present invention, they are collectively referred to as a printer for security paper, and the term 'printer for security paper' encompasses devices implementing only a single function, such as a printer, a facsimile machine, a copier and a scanner, as well as a multifunction printer incorporating functions of the printer, the facsimile machine, the copier, and the scanner.

BACKGROUND ART

In publication of granted patent 10-1174078, a pressing plate having a security paper sensor is provided on a cassette having sheets of printing paper stacked thereon to sense security paper before it is fed from the cassette and to control an operation of a device based on the sensing result. However, there are disadvantages in that a separate structure needs to be disposed on a common cassette, an interference occurring between sheets of security paper stacked on the cassette interrupts the operation of the sensor, and a manual tray (MT) or multi-purpose tray (MPT) function is often not available.

Likewise, in publication of granted patent 10-1265900, a security paper sensor is disposed on a cassette by a rotatable link. As in the above publication, there are still disadvantages in that a separate structure needs to be disposed on a common cassette, an interference occurring between the stacked sheets of security paper interrupts the operation of the sensor, and a manual tray function is not available.

Also in publication of granted patent 10-1278388, as an improvement to the above technologies, whether the topmost paper stacked on a cassette is security paper is determined by moving a sensor in a feeding direction or opposite direction, rather than sensing a difference in magnetic fields generated during the feeding. However, there are still disadvantages in that a separate structure needs to be disposed on a common cassette, a separate moving mechanism is required, and a manual tray function is not available.

Likewise, publication of granted patent 10-1700166 discloses a device for identifying security paper, in which a sensor for sensing security paper can be disposed on a cassette having sheets of paper stacked thereon in a non-contact manner with paper. However, there are still disadvantages in that a separate structure needs to be disposed on a common cassette, an interference occurring between the stacked sheets of security paper interrupts the operation of the sensor, and a manual tray function is not available.

DISCLOSURE OF THE INVENTION

An object of the present invention is to provide a printer for security paper which can solve the foregoing problems of the conventional art, and more specifically, to provide a printer for security paper which can perform a printing operation by distinguishing between security paper and normal paper, without disposing a separate structure on a cassette.

Another object of the present invention is to provide a printer for security paper which can distinguish and detect between security paper and normal paper, even with a manual tray.

According to an aspect of the present invention for achieving the above objects, there is provided a printer for security paper, including: a security paper sensor disposed on a printing paper feeding path; and a control unit for comparing a first sensing value sensed by the security paper sensor when printing paper to be determined is not present near the security paper sensor with one or more second sensing values sensed by the security paper sensor for the corresponding printing paper on the feeding path, during the course of conveying the corresponding printing paper on the feeding path, determining printing paper as security paper when a comparison value is above a predefined reference value, and determining printing paper as normal paper when the comparison value is below the predefined reference value.

In some embodiments, the printer for security paper includes: a registration roller for correcting a skew of printing paper; and a paper-in sensor disposed in front of the registration roller on the printing paper feeding path, wherein the security paper sensor is disposed between the registration roller and the paper-in sensor, the first sensing value is a value sensed by the security paper sensor when the paper-in sensor senses printing paper, and the second sensing value is a value sensed by the security paper sensor for a certain period of time after the paper-in sensor senses printing paper.

In some embodiments, the printer for security paper includes: a first optical sensor disposed on the printing paper feeding path, wherein the security paper sensor is disposed behind the first optical sensor on the printing paper feeding path, the first sensing value is a value sensed by the security paper sensor when the first optical sensor senses printing paper that has not been sensed on the printing paper feeding path, and the second sensing value is a value sensed by the security paper sensor for a certain period of time after the first optical sensor senses printing paper.

According to another aspect of the present invention for achieving the above objects, there is provided a printer for security paper, including: a PCB on which a first optical sensor and a security paper sensor are disposed in sequence, the first optical sensor being positioned on a printing paper feeding path to sense the presence or absence of printing paper fed along the printing paper feeding direction, the security paper sensor sensing whether printing paper being fed is security paper; and a control unit for comparing a first sensing value sensed by the security paper sensor when printing paper to be determined, that has not been sensed, is sensed by the first optical sensor on the feeding path with one or more second sensing values sensed by the security paper sensor for the corresponding printing paper on the feeding path, determining printing paper as security paper when a comparison value is above a predefined reference value, and determining printing paper as normal paper when the comparison value is below the predefined reference value.

According to the present invention, the printer for security paper can be easily applied to the common multifunction printer without having the problems of the conventional art.

In addition, according to the present invention, the printer for security paper can control the printing operation by determining whether printing paper is security paper, without disposing a separate structure on the cassette.

Further, according to the present invention, the printer for security paper can determine whether printing paper is security paper, even with the manual tray function.

BEST MODE FOR CARRYING OUT THE INVENTION

Hereinafter, the configuration of the printer for security paper according to the present invention will be described in detail with reference to the accompanying drawings. The following description only illustrates a preferred example of the present invention.

Figure 1:
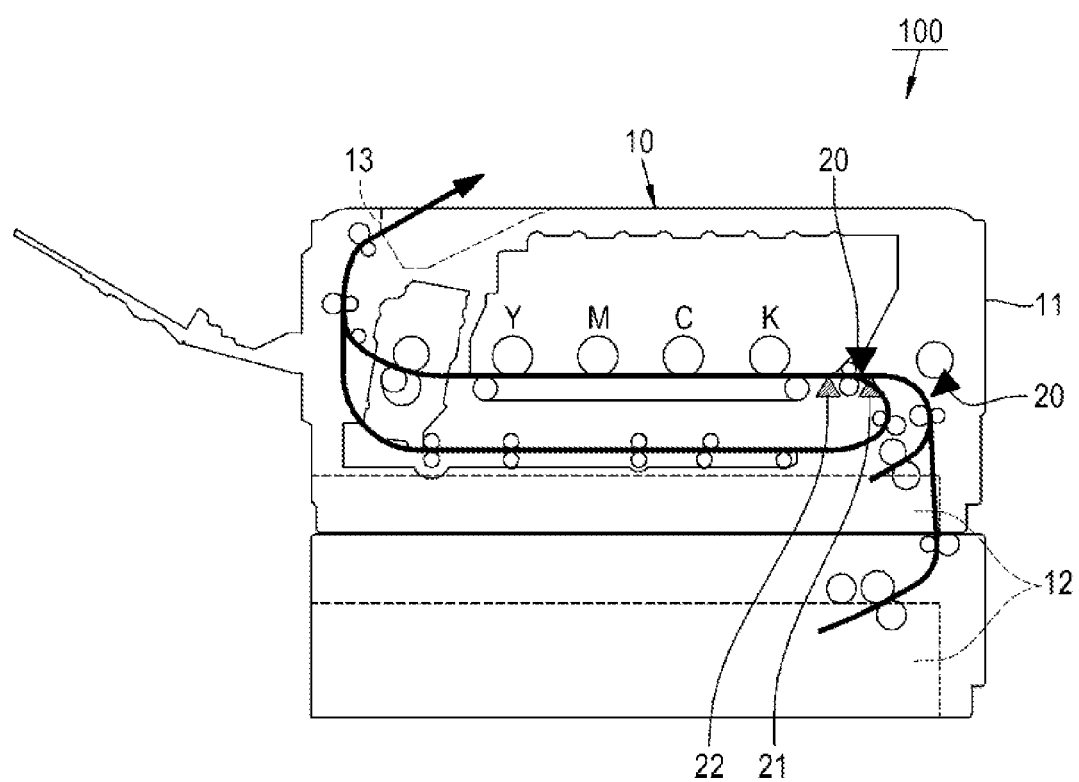
FIG. 1 is a view showing a printing paper feeding path in a printer for security paper according to the present invention.
Figure 2:
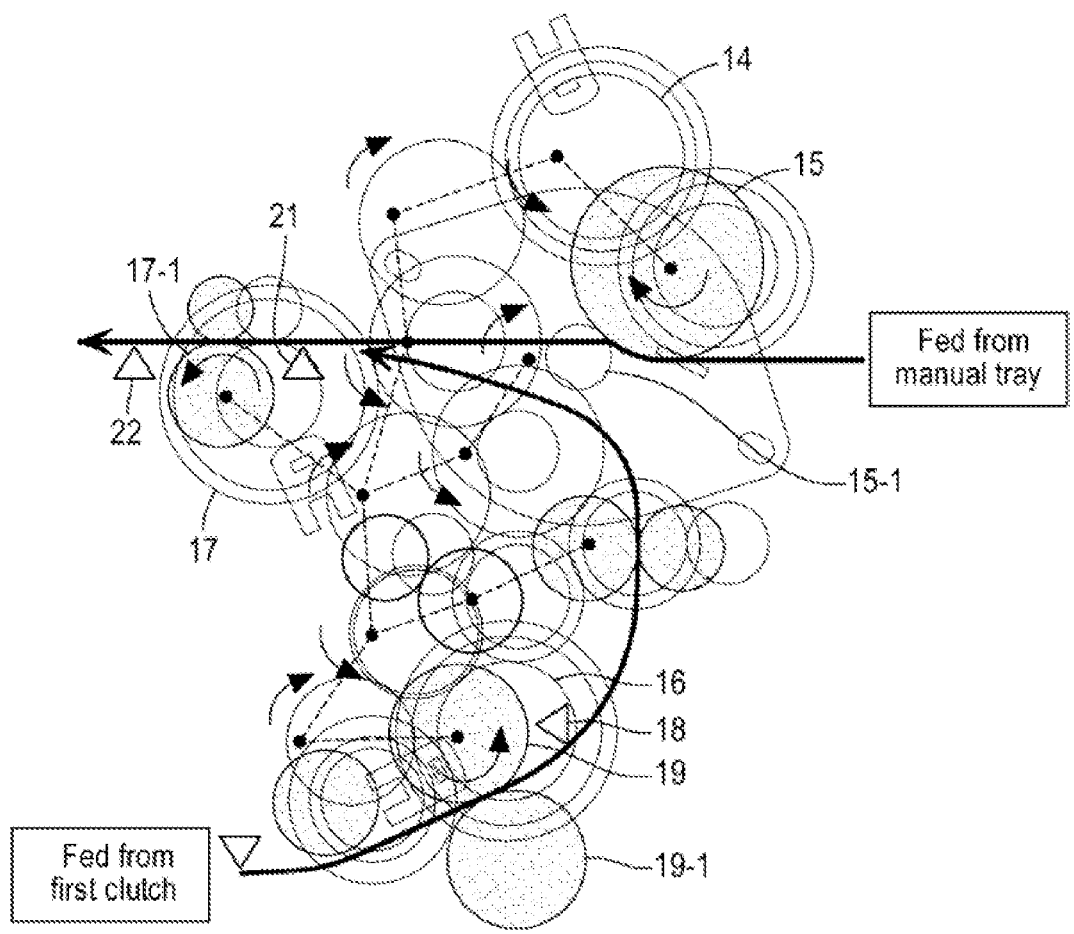
FIG. 2 is an explanatory view showing a printing paper feeding operation in the printer for security paper according to the present invention.

FIG. 1 is a view showing a printing paper feeding path in the printer for security paper according to the present invention, and FIG. 2 is an explanatory view showing a printing paper feeding operation in the printer for security paper according to the present invention.

In general, a multifunction printer indicates one capable of implementing all functions of a printer, a facsimile machine, a copier, and a scanner. However, as discussed later, since the present invention is characterized by determining whether printing paper to be fed is normal paper or security paper and performing a printing operation based on the determination result, it may be understood that the multifunction printer also encompasses the printer, the facsimile machine, or the copier. That is, as far as the printer or the copier can implement the function of the present invention described below depending on printing paper to be fed, it falls within the scope of the present invention. Alternatively, of course, a common multifunction printer implementing all the functions also falls within the scope of the present invention.

Referring to FIGS. 1 and 2, in the case of a manual tray (MT) or multi-purpose tray (MPT), when a front cover 11 of a printer for security paper 100 is opened and printing paper is fed from the manual tray (MT) or when printing paper is fed from the multi-purpose tray (MPT) which is not illustrated, a paper feed motor 15-1 starts to be rotated, an MPT clutch 14 is turned on, and a paper feed roller 15 of the manual tray is rotated, such that printing paper is fed from the manual tray. When a paper-in sensor 21 is turned on by printing paper conveyed from the manual tray, printing paper is further advanced by a certain distance to the extent that it hits a registration roller 17-1, to correct a skew of printing paper. In turn, a registration clutch 17 is turned on to cause the registration roller 17-1 to convey printing paper. When a write sensor 22 is turned on by printing paper being conveyed, an LED head operates to perform the exposure on the OPC, and a toner is adhered to the exposed portion of the OPC and transferred to printing paper being conveyed as the OPC is rotated. Finally, printing paper is discharged through a printing paper outlet 13 on one side of a top cover 10.

When printing paper is fed from a cassette 12, the paper feed motor 15-1 starts to be rotated, a first clutch 16 is turned on, and a paper feed roller 19 of the cassette 12 is rotated, such that printing paper is lifted from the tray of the cassette 12 by the paper feed roller 19 and a separation roller 19-1. Here, when a paper feed sensor 18 is turned on by printing paper lifted by the paper feed roller 19, the completion of the normal printing paper feeding operation is recognized, the first clutch 16 is turned off to stop a printing paper pickup operation, and printing paper is conveyed to the paper-in sensor 21. When the paper-in sensor 21 is turned on by printing paper conveyed from the tray of the cassette 12, printing paper is further advanced by a certain distance to the extent that it hits the registration roller 17-1, to correct a skew of printing paper. In turn, the registration clutch 17 is turned on to cause the registration roller 17-1 to convey printing paper. When the write sensor 22 is turned on by printing paper being conveyed, the LED head operates to perform the exposure on the OPC, and the toner is adhered to the exposed portion of the OPC and transferred to printing paper being conveyed as the OPC is rotated. Finally, printing paper is discharged through the printing paper outlet 13 on one side of the top cover 10. Here, the output forms of the paper-in sensor 21 are high and low voltages, and the paper-in sensor 21 serves to determine whether printing paper from the manual tray or the tray of the cassette 12 has reached a corresponding position and to become a reference point of a certain distance when printing paper is further advanced to the registration roller 17-1 by the distance for registration purposes. The output forms of the write sensor 22 are also high and low voltages, and the write sensor 22 serves to determine whether printing paper has reached a corresponding position and to become a reference point of causing the LED head to perform the exposure on the OPC drum to start the printing operation.

According to one embodiment of the present invention, a security paper sensor 20 is positioned on the printing paper feeding path. In addition, according to one embodiment of the present invention, the security paper sensor 20 is positioned between the paper-in sensor 21 and the write sensor 22 on the printing paper feeding path.

In the present invention, the term 'security paper' indicates paper (printing paper) which a special material is inserted into or which is printed using the special material, said paper generating a signal for distinguishing the characteristics of the material, by using a non-crystalline or amorphous material, a magnetic material (alloy), a nano-size metal wire, and a magnetic resonance material to resonate at a specific frequency.

This security paper is sensed by an electromagnetic (EM) sensor. That is, when a soft magnetic substance in security paper approaches an AC magnetic field generated by the sensor, the AC magnetic field is changed, such change generates a high frequency spectrum, and security paper is sensed by the high frequency spectrum. This sensor may include a transmitting coil for generating an AC magnetic field, a receiving coil for sensing a change in the AC magnetic field generated by the transmitting coil, and an electronic system for controlling the AC magnetic field generated by the transmitting coil and processing the signal transmitted from the receiving coil.

Alternatively, security paper may contain a plurality of conductive fine metal strips irregularly distributed on the entire paper. Any kind of metal may be used as long as it has conductivity and generates an induced current in a magnetic field. As an example, the metal strips contained in paper may have a small size not to be easily recognized by the user with the naked eye, for example, with a thickness of 0.1 to 3 μm, a length of 0.3 to 4 cm and a width of 0.1 to 0.5 mm. In the case of security paper having conductive fine metal strips distributed thereon, a primary magnetic field generated by an inductive sensor induces an eddy current in the fine metal strips of paper being fed, and a secondary magnetic field generated by the eddy current influences on the primary magnetic field generated by the inductive sensor, to change the strength of the magnetic field. Therefore, the inductive sensor transmits a security paper sensing signal to a sensing unit and a control unit discussed later, depending on whether the strength of the magnetic field generated by the inductive sensor has been changed.

Figure 3:
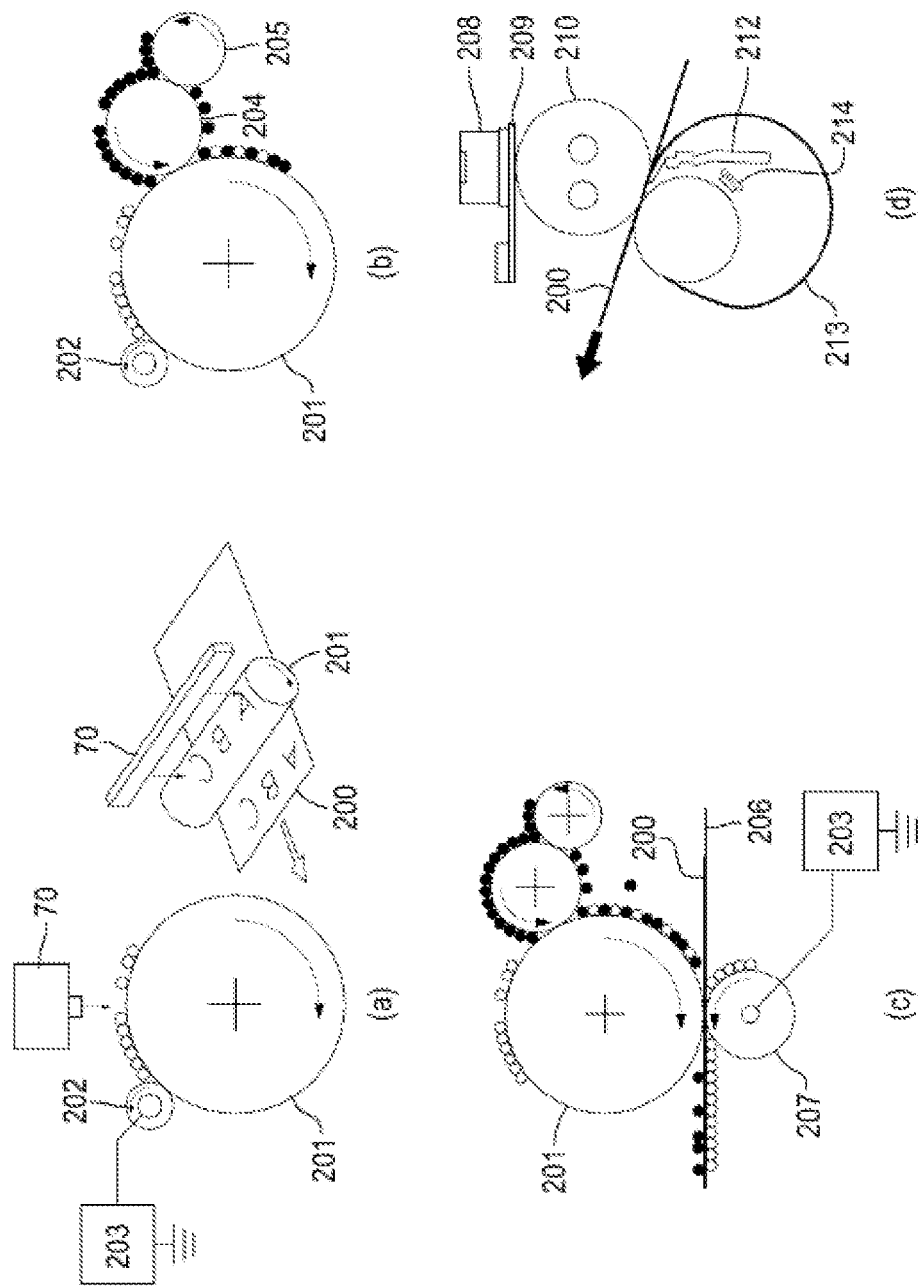
FIG. 3 is an explanatory view showing a printing process through a KCMY LED head or laser scanner unit (LSU) in the printer for security paper according to the present invention.

FIG. 3 is an explanatory view showing a printing process through a KCMY LED head or laser scanner unit (LSU) in the printer for security paper according to the present invention. FIG. 3A is an explanatory view showing charging and exposure processes. Referring to FIG. 3A, a voltage is applied to a charging roller 202 to electrically charge a surface of an OPC drum 201. Here, a toner is not adhered to the charged surface. In turn, when the charged portion reaches the position of the KCMY LED head 70 (or LSU 70) as the OPC drum 201 is rotated, light corresponding to an image which the KCMY LED head 70 intends to print is scanned on the charged surface of the OPC drum 201, as a result of which an electrostatic latent image having the same shape as the image is formed. FIG. 3B is an explanatory view showing a development process. Referring to FIG. 3B, a toner in a toner container is put on a sponge roller 205 and transferred to a developing roller 204 charged by a voltage, the toner put on the developing roller 204 is adhered only to the electrostatic latent image formed on the surface of the OPC drum 201 by the exposure of the KCMY LED head 70, and the remaining toner is recovered by the toner container. FIG. 3C is an explanatory view showing a transferring process. Referring to FIG. 3C, the toner put on the OPC drum 201 is transferred to printing paper 200 on a transfer belt 206 by a potential difference with a transfer roller 207, to form an image on printing paper 200. FIG. 3D is an explanatory view showing a fusing process. Referring to FIG. 3D, the toner on printing paper 200 is fused on printing paper 200 by a heat roller 210 heated at a high temperature, which leads to the completion of the printing operation.

Figure 4:
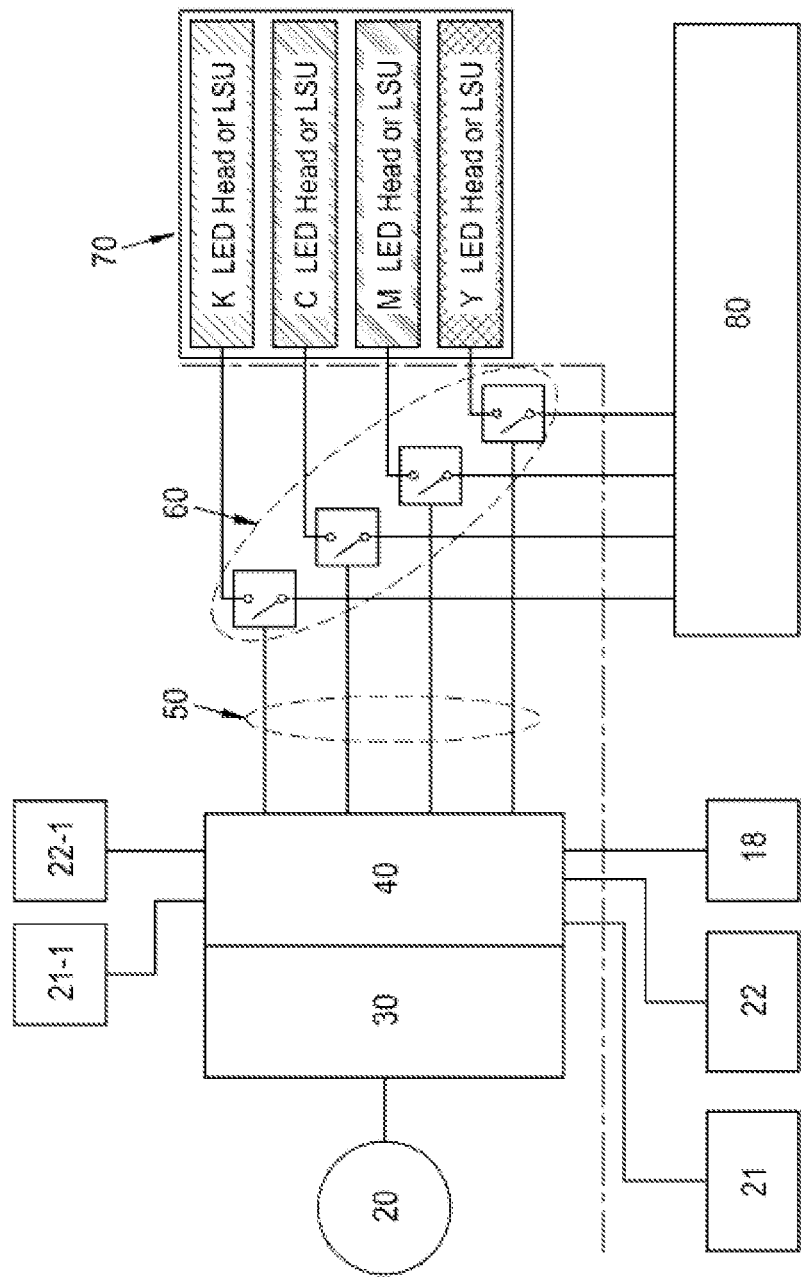
FIG. 4 is a block diagram showing a configuration related to security paper sensing in the printer for security paper according to one embodiment of the present invention.
Figure 5:
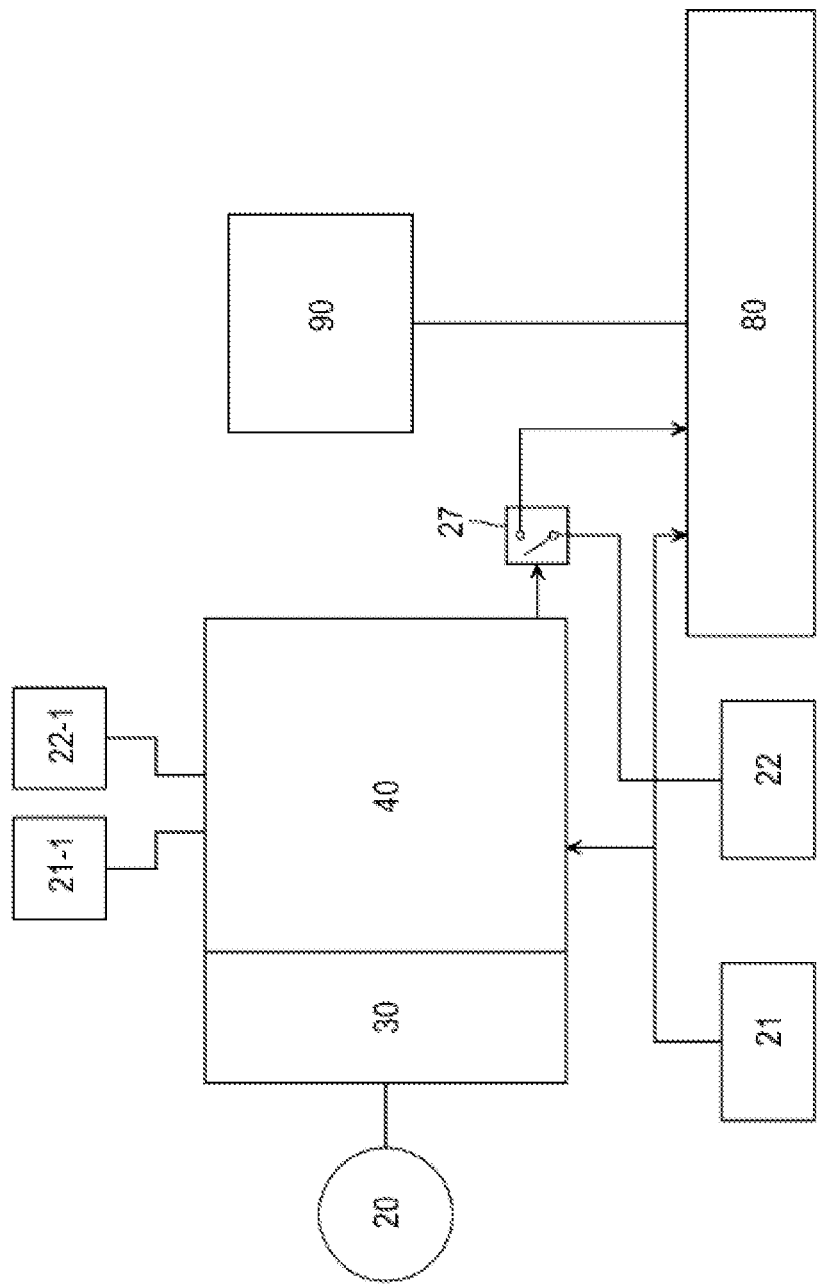
FIG. 5 is a block diagram showing a configuration related to security paper sensing in the printer for security paper according to another embodiment of the present invention.
Figure 6:
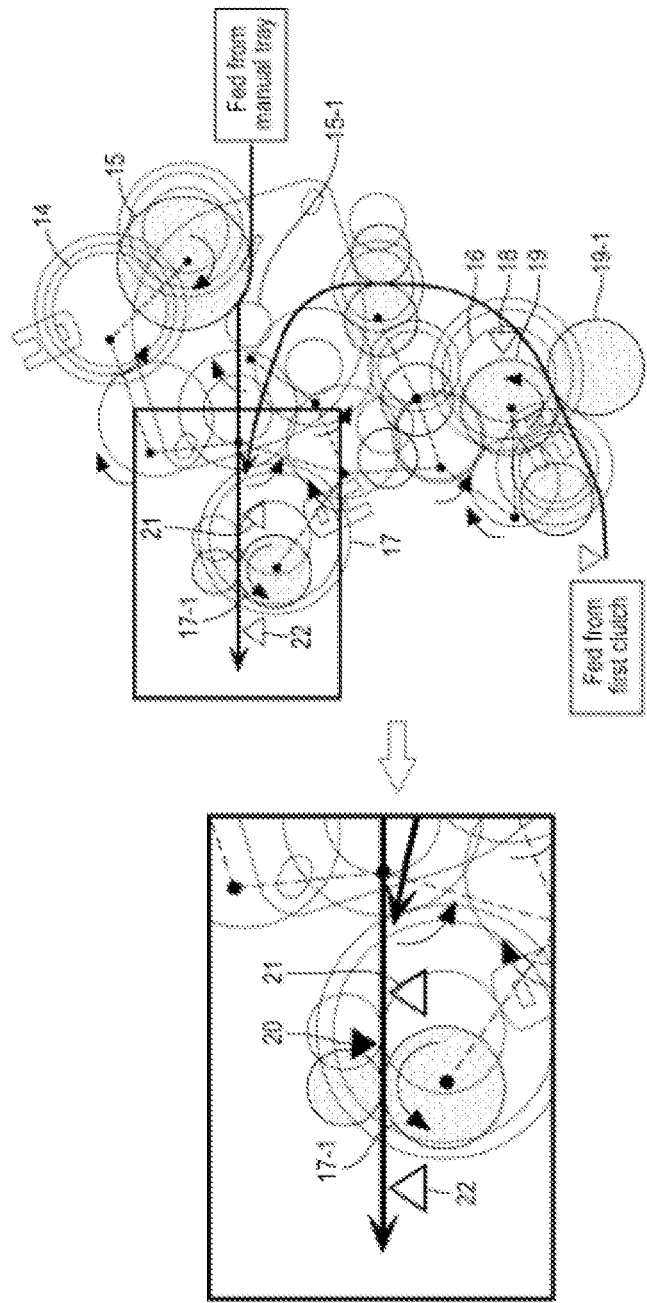
FIG. 6 is an explanatory view showing a position of a security paper sensor and an operation of sensing security paper and normal paper according to one embodiment of the present invention.
Figure 7:
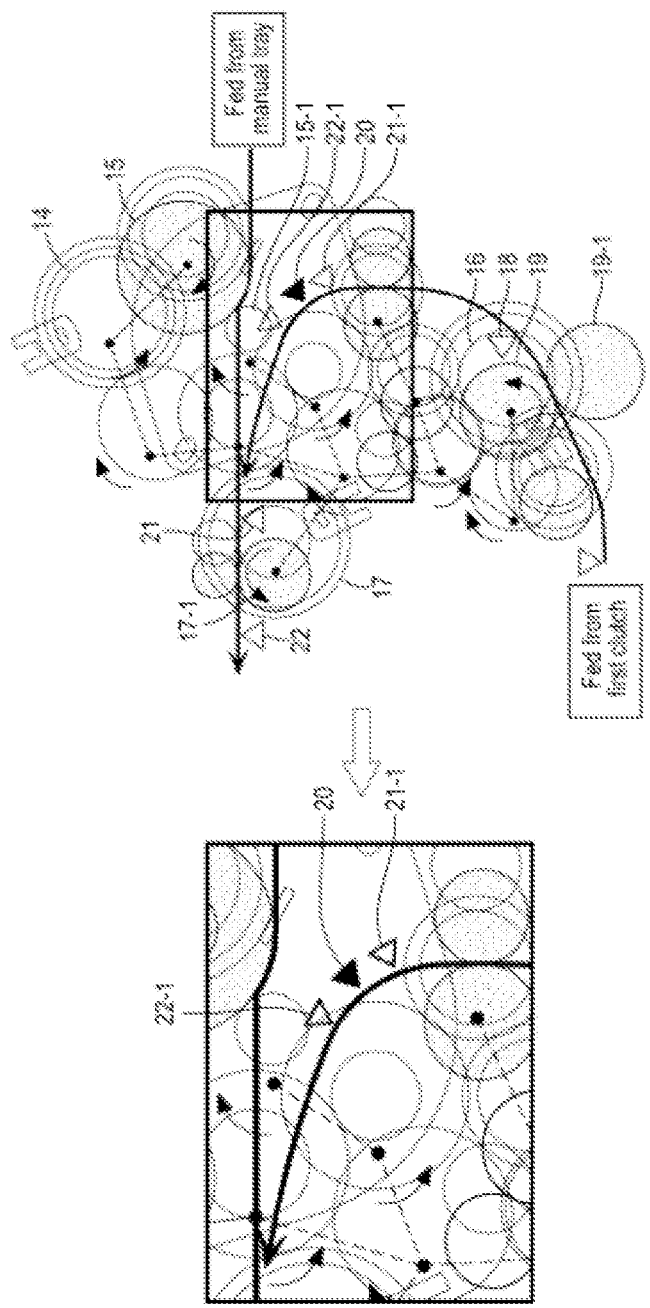
FIG. 7 is an explanatory view showing a position of a security paper sensor and an operation of sensing security paper and normal paper according to another embodiment of the present invention.
Figure 8:
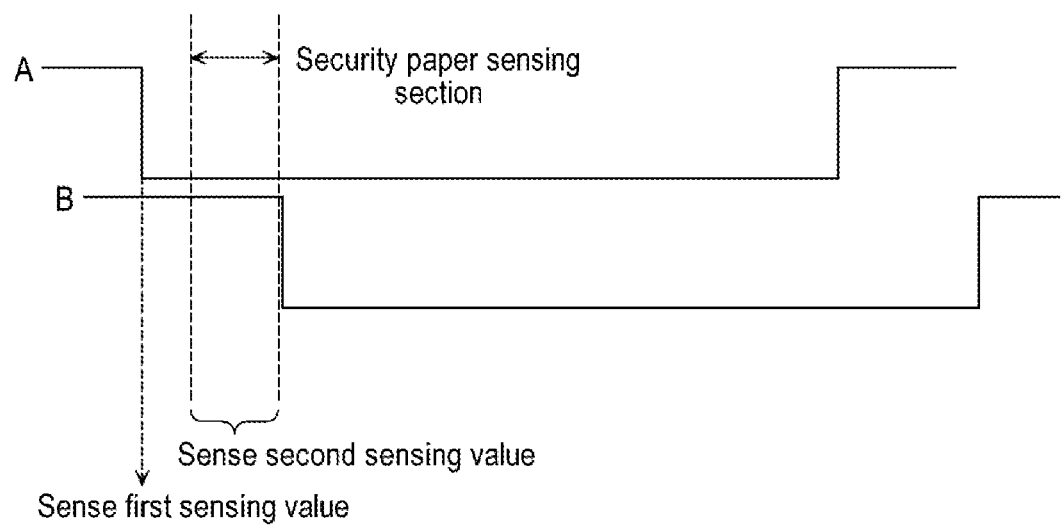
FIG. 8 is an explanatory view showing a time the security paper sensor senses a first sensing value and a section the security paper sensor senses a second sensing value according to the present invention.

FIG. 4 is a block diagram showing a configuration related to security paper sensing in the printer for security paper according to one embodiment of the present invention, and FIG. 5 is a block diagram showing a configuration related to security paper sensing in the printer for security paper according to another embodiment of the present invention. FIG. 6 is an explanatory view showing a position of a security paper sensor and an operation of sensing security paper and normal paper according to one embodiment of the present invention. FIG. 7 is an explanatory view showing a position of a security paper sensor and an operation of sensing security paper and normal paper according to another embodiment of the present invention. FIG. 8 is an explanatory view showing sections the security paper sensor senses a first sensing value and a second sensing value according to the present invention.

As can be seen in the block diagram of FIG. 4 of the present invention, a security paper sensor 20 is connected to a sensing unit 30 and a control unit 40, and the control unit 40 is connected to a paper-in sensor 21, a write sensor 22 and a paper feed sensor 18. In addition, in some embodiments, the control unit 40 is connected to a first optical sensor 21-1 and a second optical sensor 22-1. How to determine security paper in the printer for security paper according to the present invention by means of these connections will be described later.

The security paper sensor 20 is disposed on the printing paper feeding path, and the control unit 40 compares a first sensing value sensed by the security paper sensor 20 when printing paper to be determined as security paper or normal paper is not present near the security paper sensor 20 with one or more second sensing values sensed by the security paper sensor 20 for the corresponding printing paper on the feeding path, during the course of conveying the corresponding printing paper on the feeding path, determines printing paper as security paper when the comparison value is above a reference value previously defined to determine security paper, and determines printing paper as normal paper when the comparison value is below the reference value.

In addition, the control unit 40 turns on/off the connection to the KCMY LED head 70 or the LSU 70 depending on the sensing value of the security paper sensor 20. As discussed later, printing paper being fed passes through the paper-in sensor 21 and the write sensor 22, a signal of printing paper being fed is transmitted to a printer engine controller 80, the connection to the KCMY LED head 70 or the LSU 70 is turned on, and thus the printing operation proceeds.

According to one embodiment of the present invention, printing paper being fed is determined as security paper or normal paper depending on the sensing value of the security paper sensor 20, the connection to the KCMY LED head 70 or the LSU 70 is turned on/off, and thus the printing operation normally proceeds or does not proceed at all. That is, when printing paper is sensed as security paper, the connection to the KCMY LED head 70 or the LSU 70 is made so that the printing operation normally proceeds, and when printing paper is sensed as normal paper, the connection to the KCMY LED head 70 or the LSU 70 is not made so that the printing operation does not proceed.

Referring to FIG. 5, in another embodiment of the present invention, the control unit 40 determines printing paper to be fed as security paper or normal paper depending on the sensing value of the security paper sensor 20 and turns on/off the signal from the write sensor 22 to the printer engine controller 80 so that the printing operation normally proceeds or does not proceed at all. That is, when printing paper is sensed as security paper, the control unit 40 turns on a switch 27 to normally transmit the signal from the write sensor 22 to the printer engine controller 80 so that the printing operation normally proceeds, and when printing paper is sensed as normal paper, the control unit 40 turns off the switch 27 not to transmit the signal from the write sensor 22 to the printer engine controller 80 to output blank paper or allows the printer engine controller 80 to stop an BLDC motor 90 to cause a paper jam, so that the printing operation does not proceed.

According to one embodiment of the present invention shown in FIG. 6, there are the registration roller 17-1 for correcting a skew of printing paper and the paper-in sensor 21 disposed in front of the registration roller 17-1 on the printing paper feeding path. The security paper sensor 20 is positioned behind the paper-in sensor 21, and the security paper sensor 20 may be disposed between the registration roller 17-1 and the paper-in sensor 21. The first sensing value may be a value sensed by the security paper sensor 20 when the paper-in sensor 21 senses printing paper, and the second sensing value may be a value sensed by the security paper sensor 20 for a certain period of time after the paper-in sensor 21 senses printing paper. In FIG. 8, A may be an output value from the paper-in sensor 21. The security paper sensor 20 senses the first sensing value when the output value from the paper-in sensor 21 is changed due to the entry of printing paper, i.e., when waveform A of FIG. 8 is changed from high to low, and then the security paper sensor 20 senses the second sensing value for printing paper for a certain period of time as the printing paper passes.

Also in the multifunction printer for security paper, the write sensor 22 may be disposed behind the registration roller 17-1 on the printing paper feeding path, and the second sensing value may be a value sensed by the security paper sensor 20 until the write sensor 22 senses printing paper.

In addition, in some embodiments, the security paper sensor 20 may be positioned between the paper-in sensor 21 and the write sensor 22, B of FIG. 8 may be an output value from the write sensor 22, and the second sensing value may be a value sensed by the security paper sensor 20 until the write sensor 22 senses printing paper. As a result, the security paper sensor 20 will sense a change in the magnetic field caused when a front portion of printing paper passes. The security paper sensor 20 transmits a sensed analog signal to the sensing unit 30, and the sensing unit 30 converts the analog signal from the security paper sensor 20 to a digital signal and transmits the digital signal to the control unit 40. The control unit 40 compares the first sensing value with the one or more second sensing values sensed by the security paper sensor 20, determines printing paper as security paper when the comparison value is above the predefined reference value, and determines printing paper as normal paper when the comparison value is below the predefined reference value. When printing paper is determined as security paper, the control unit 40 turns on a KCMY head enable switch 60 by KCMY head switch control 50 to connect KCMY head enable to the KCMY LED head 70 or the LSU 70 so that the printing operation proceeds. Meanwhile, when printing paper is determined as normal paper, the control unit 40 turns off the KCMY head enable switch 60 by the KCMY head switch control 50 to disconnect the KCMY head enable from the KCMY LED head 70 or the LSU 70 so that the printing operation does not proceed. Since a page determined as normal paper is not printed, it may be troublesome to reprint the corresponding page that has not been printed yet, but it is possible to warn the user that the printing operation should be performed on security paper. Along with this, when printing paper is determined as normal paper, it is possible to warn the user by separate alarm means (sound, lamp, etc.), and also possible to record which user tried to print using normal paper through a server connected to a network.

It is also possible to control the signal from the write sensor 22 to be turned on/off depending on security paper or normal paper, without turning on/off the connection to the KCMY LED head 70 or the LSU 70. As printing paper passes, i.e., while printing paper enters, the paper-in sensor 21 is turned on, and then the write sensor 22 is turned on, the security paper sensor 20 transmits the first sensing value and the second sensing value to the sensing unit 30 as an analog signal, and the sensing unit 30 converts the analog signal from the security paper sensor 20 to a digital signal and transmits the digital signal to the control unit 40, as described above. The control unit 40 compares the first sensing value with the one or more second sensing values sensed by the security paper sensor 20, determines printing paper as security paper when the comparison value is above the predefined reference value, and determines printing paper as normal paper when the comparison value is below the predefined reference value.

When printing paper is determined as security paper, the control unit 40 turns on the signal from the subsequent write sensor 22, such that a series of printing processes including charging, exposure, development, transfer, fusing, cleaning and static elimination proceed, but when printing paper is determined as normal paper, the control unit 40 turns off the switch 27 to turn off the signal from the write sensor 22 to the printer engine controller 80 to output blank paper or allows the printer engine controller 80 to stop the BLDC motor 90 to cause a paper jam, so that the printing operation does not proceed.

According to another embodiment of the present invention shown in FIG. 7, the first optical sensor 21-1 is disposed on any point of the printing paper feeding path and the security paper sensor 20 is disposed behind the first optical sensor 21-1. In FIG. 8, A may be an output value from the first optical sensor 21-1. The security paper sensor 20 senses the first sensing value when the output value from the first optical sensor 21-1 is changed due to the entry of printing paper, i.e., when waveform A of FIG. 8 is changed from high to low, and then the security paper sensor 20 senses the second sensing value for printing paper for a certain period of time as the printing paper passes. The distance between the first optical sensor 21-1 and the security paper sensor 20 is preferably smaller than the distance between printing paper and the succeeding printing paper on the feeding path. The reason for this is because the first sensing value should be sensed when there is no printing paper near the security paper sensor 20. However, if the distance is greater than the distance between the rear end of the preceding printing paper and the front end of the succeeding printing paper, the first sensing value may be sensed when there is printing paper near the security paper sensor 20, which leads to inaccurate determination of security paper.

In some embodiments, the first optical sensor 21-1 may be the paper feed sensor 18, and the security paper sensor 20 is positioned behind the paper feed sensor 18. Moreover, in some embodiments, the second optical sensor 22-1 may be disposed behind the security paper sensor 20 on the printing paper feeding path. In FIG. 8, B may be an output value from the second optical sensor 22-1, and the second sensing value may be a value sensed by the security paper sensor 20 until the second optical sensor 22-1 senses printing paper. As a result, the security paper sensor 20 will sense a change in the magnetic field caused when a front portion of printing paper passes. The security paper sensor 20 transmits a sensed analog signal to the sensing unit 30, and the sensing unit 30 converts the analog signal from the security paper sensor 20 to a digital signal and transmits the digital signal to the control unit 40. The control unit 40 compares the first sensing value with the one or more second sensing values sensed by the security paper sensor 20, determines printing paper as security paper when the comparison value is above the predefined reference value, and determines printing paper as normal paper when the comparison value is below the predefined reference value. When printing paper is determined as security paper, the control unit 40 turns on the KCMY head enable switch 60 by the KCMY head switch control 50 to connect the KCMY head enable to the KCMY LED head 70 or the LSU 70 so that the printing operation proceeds. Meanwhile, when printing paper is determined as normal paper, the control unit 40 turns off the KCMY head enable switch 60 by the KCMY head switch control 50 to disconnect the KCMY head enable from the KCMY LED head 70 or the LSU 70 so that the printing operation does not proceed. Since a page determined as normal paper is not printed, it may be troublesome to reprint the corresponding page that has not been printed yet, but it is possible to warn the user that the printing operation should be performed on security paper. Along with this, when printing paper is determined as normal paper, it is possible to warn the user by separate alarm means (sound, lamp, etc.), and also possible to record which user tried to print using normal paper through the server connected to the network.

It is also possible to control the signal from the write sensor 22 to be turned on/off depending on security paper or normal paper, without turning on/off the connection to the KCMY LED head 70 or the LSU 70. After printing paper enters and the first optical sensor 21-1 is turned on, the security paper sensor 20 transmits the first sensing value and the second sensing value to the sensing unit 30 as an analog signal, and the sensing unit 30 converts the analog signal from the security paper sensor 20 to a digital signal and transmits the digital signal to the control unit 40, as described above. The control unit 40 compares the first sensing value with the one or more second sensing values sensed by the security paper sensor 20, determines printing paper as security paper when the comparison value is above the predefined reference value, and determines printing paper as normal paper when the comparison value is below the predefined reference value.

When printing paper is determined as security paper, the control unit 40 turns on the signal from the subsequent write sensor 22, such that a series of printing processes including charging, exposure, development, transfer, fusing, cleaning and static elimination proceed, but when printing paper is determined as normal paper, the control unit 40 turns off the switch 27 to turn off the signal from the write sensor 22 to the printer engine controller 80 to output blank paper or allows the printer engine controller 80 to stop the BLDC motor 90 to cause a paper jam, so that the printing operation does not proceed.

In the above embodiment, a separate sensor for sensing printing paper is disposed in front of the security paper sensor 20. However, it is also provided in another embodiment that the security paper sensor 20 is disposed on any point of the printing paper feeding path, without a separate sensor for sensing printing paper, and that the control unit 40 compares a first sensing value sensed by the security paper sensor 20 when printing paper to be determined as security paper or normal paper is not present near the security paper sensor 20 with one or more second sensing values sensed by the security paper sensor 20 for the corresponding printing paper on the feeding path, during the course of conveying the corresponding printing paper on the feeding path, determines printing paper as security paper when the comparison value is above a reference value previously defined to determine security paper, and determines printing paper as normal paper when the comparison value is below the reference value. Further, according to the above embodiments, even when printing paper is fed from the manual tray (MT) or multi-purpose tray (MPT) as well as from the cassette, it is possible to distinguish between security paper and normal paper to allow or prevent the printing operation.

Figure 9:
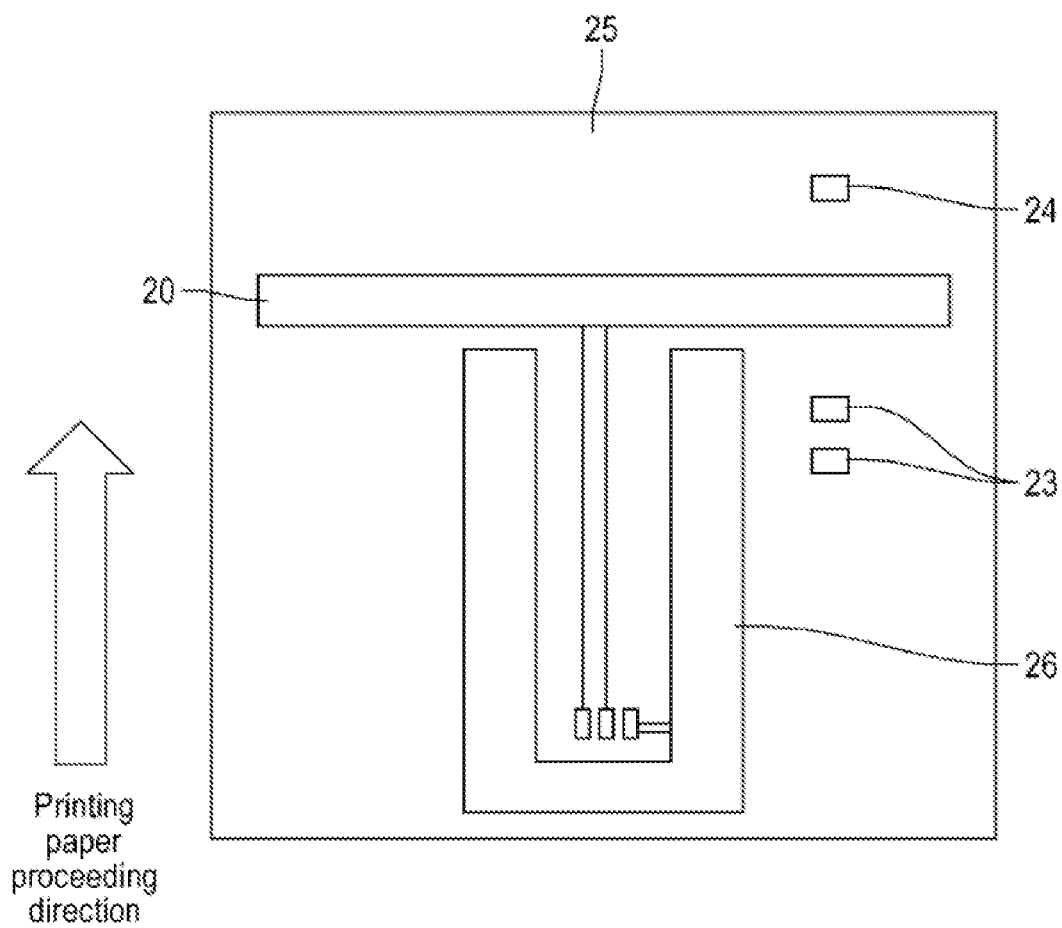
FIG. 9 is a plan view showing a PCB with a security paper sensor disposed thereon according to a further embodiment of the present invention.
Figure 10:
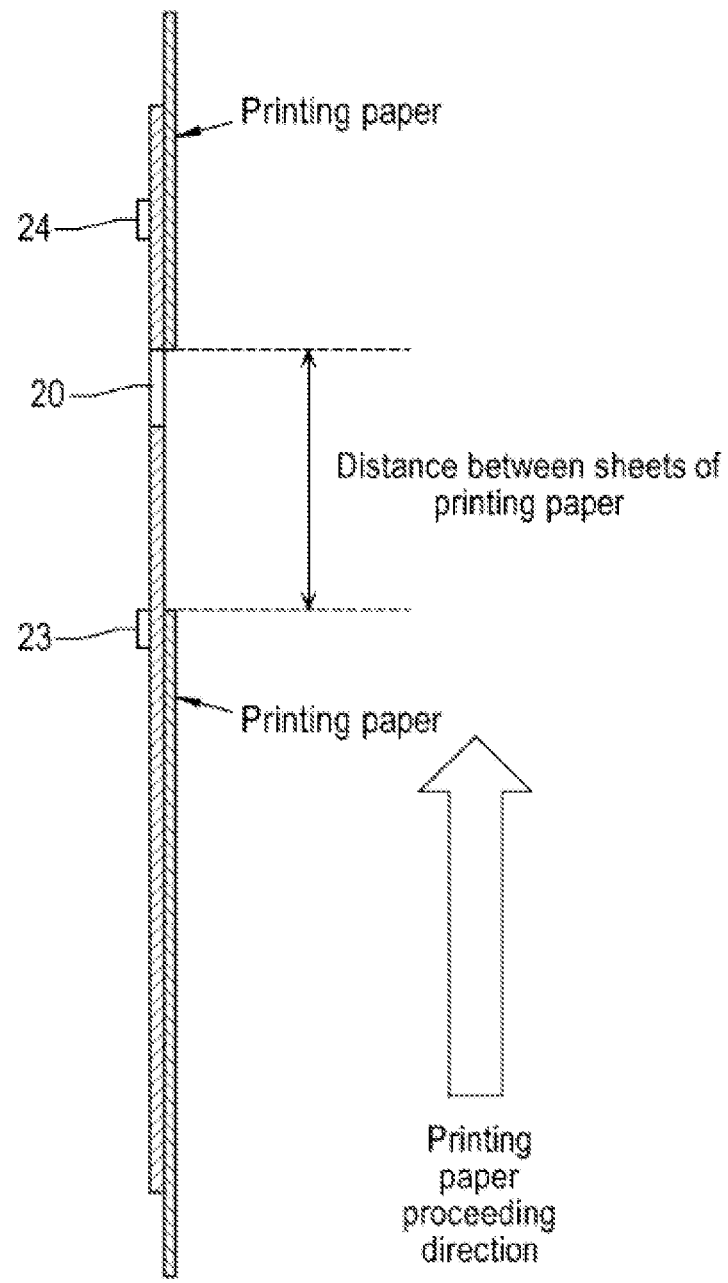
FIG. 10 is an explanatory view showing a distance between a first optical sensor and a security paper sensor according to one embodiment of the present invention.

FIG. 9 is a plan view showing a PCB with a security paper sensor disposed thereon according to a further embodiment of the present invention. FIG. 10 is an explanatory view showing a distance between a first optical sensor and a security paper sensor according to one embodiment of the present invention.

According to another embodiment of the present invention shown in FIG. 9, a first optical sensor 23 for sensing the presence or absence of printing paper fed along the printing paper feeding direction is disposed on a PCB 25, and subsequently, a security paper sensor 20 for sensing whether printing paper being fed is security paper is disposed thereon. The security paper sensor 20 senses a first sensing value when printing paper to be determined, that has not been sensed, is sensed by the first optical sensor 23, and then senses one or more second sensing values for the corresponding printing paper on the printing paper feeding path for a certain period of time. Referring to FIG. 8, A may be an output value from the first optical sensor 23. The security paper sensor 20 senses the first sensing value when the output value from the first optical sensor 23 is changed due to the entry of printing paper, i.e., when waveform A is changed from high to low, and then the security paper sensor 20 senses the second sensing value for printing paper for a certain period of time as the printing paper passes. Referring to FIG. 10, the distance between the first optical sensor 23 and the security paper sensor 20 is preferably smaller than the distance between printing paper and the succeeding printing paper on the feeding path. The reason for this is because the first sensing value should be sensed when there is no printing paper near the security paper sensor 20. However, if the distance is greater than the distance between the rear end of the preceding printing paper and the front end of the succeeding printing paper, the first sensing value may be sensed when there is printing paper near the security paper sensor 20, which leads to inaccurate determination of security paper. In some embodiments, the PCB 25 may include one or more holes, and the first optical sensor 23 may be disposed in any of the holes, taking into consideration the distance between sheets of printing paper consecutively fed in the corresponding printer. Also in some embodiments, the PCB 25 may include one or more holes, and the first optical sensor 23 may be disposed in each of the holes, i.e., the PCB 25 may include two or more first optical sensors 23 spaced apart along the printing paper feeding direction. In this case, in consideration of the distance between sheets of printing paper consecutively fed in the printer being used, the control unit 40 selects the first optical sensor 23 for sensing the presence or absence of printing paper being fed, among the two or more first optical sensors 23, and controls the security paper sensor 20 to sense the first sensing value when printing paper to be determined is sensed by the selected first optical sensor 23. In some embodiments, the security paper sensor 20 disposed on the PCB 25 may be formed in a bar shape perpendicular to the printing paper feeding direction, in the case of which the security paper sensor 20 can sense a wide surface in a transverse direction of printing paper in a short time, which leads to high accuracy of sensing security paper. The PCB 25 may be an FPCB 25, and a ground metal pattern 26 for removing static electricity in contact with printing paper may be further provided in a printing paper contact part of the FPCB 25. In some embodiments, a second optical sensor 24 may be disposed behind the security paper sensor 20 on the printing paper feeding path of the PCB 25. In FIG. 8, B may be an output value from the second optical sensor 24, in the case of which the security paper sensor 20 senses the second sensing value until the second optical sensor 24 senses printing paper.

As a result, the security paper sensor 20 will sense a change in the magnetic field caused when a front portion of printing paper passes. The security paper sensor 20 transmits a sensed analog signal to the sensing unit 30, and the sensing unit 30 converts the analog signal from the security paper sensor 20 to a digital signal and transmits the digital signal to the control unit 40. The control unit 40 compares the first sensing value with the one or more second sensing values sensed by the security paper sensor 20, determines printing paper as security paper when the comparison value is above the predefined reference value, and determines printing paper as normal paper when the comparison value is below the predefined reference value. When printing paper is determined as security paper, the control unit 40 turns on the KCMY head enable switch 60 by the KCMY head switch control 50 to connect the KCMY head enable to the KCMY LED head 70 or the LSU 70 so that the printing operation proceeds. Meanwhile, when printing paper is determined as normal paper, the control unit 40 turns off the KCMY head enable switch 60 by the KCMY head switch control 50 to disconnect the KCMY head enable from the KCMY LED head 70 or the LSU 70 so that the printing operation does not proceed. Since a page determined as normal paper is not printed, it may be troublesome to reprint the corresponding page that has not been printed yet, but it is possible to warn the user that the printing operation should be performed on security paper. Along with this, when printing paper is determined as normal paper, it is possible to warn the user by separate alarm means (sound, lamp, etc.), and also possible to record which user tried to print using normal paper through the server connected to the network.

It is also possible to control the signal from the write sensor 22 to be turned on/off depending on security paper or normal paper, without turning on/off the connection to the KCMY LED head 70 or the LSU 70. After printing paper enters and the first optical sensor 23 is turned on, the security paper sensor 20 transmits the first sensing value and the second sensing value to the sensing unit 30 as an analog signal, and the sensing unit 30 converts the analog signal from the security paper sensor 20 to a digital signal and transmits the digital signal to the control unit 40, as described above. The control unit 40 compares the first sensing value with the one or more second sensing values sensed by the security paper sensor 20, determines printing paper as security paper when the comparison value is above the predefined reference value, and determines printing paper as normal paper when the comparison value is below the predefined reference value.

When printing paper is determined as security paper, the control unit 40 turns on the signal from the subsequent write sensor 22, such that a series of printing processes including charging, exposure, development, transfer, fusing, cleaning and static elimination proceed, but when printing paper is determined as normal paper, the control unit 40 turns off the switch 27 to turn off the signal from the write sensor 22 to the printer engine controller 80 to output blank paper or allows the printer engine controller 80 to stop the BLDC motor 90 to cause a paper jam, so that the printing operation does not proceed.

According to the above embodiments, even when printing paper is fed from the manual tray (MT) or multi-purpose tray (MPT) as well as from the cassette, it is possible to distinguish between security paper and normal paper to allow or prevent the printing operation.

According to the present invention, it is possible to solve the problems of the conventional device for identifying security paper, and advantageously, it is possible to perform the printing operation in a common multifunction printer by distinguishing between security paper and normal paper, without disposing a separate structure on a cassette of the common multifunction printer, and it is also possible to use the manual tray (MT) or multi-purpose tray (MPT).

What is claimed is:

1. A printer for security paper, comprising:
   a security paper sensor disposed on a printing paper feeding path;
   a switch provided between a printer engine controller and a KCMY LED head or a laser scanner unit (LSU), for on/off switching a connection between the printer engine controller and the KCMY LED head or the laser scanner unit (LSU); and
   a controller for determining whether printing paper on the feed path is security paper or normal paper, based on sensing values from the security paper sensor, wherein when printing paper is determined as security paper, the controller turns on the switch to connect the KCMY LED head or the laser scanner unit (LSU) to the printer engine controller so that the printing operation proceeds, and when printing paper is determined as normal paper, the controller turns off the switch to disconnect the KCMY LED head or the laser scanner unit (LSU) to the printer engine controller so that the printing operation does not proceed.

2. The printer for security paper of claim 1, wherein the controller compares a first sensing value sensed by the security paper sensor when printing paper to be determined is not present near the security paper sensor with one or more second sensing values sensed by the security paper sensor for the corresponding printing paper on the feeding path, during the course of conveying the corresponding printing paper on the feeding path, determining printing paper as security paper when a comparison value is above a predefined reference value, and determining printing paper as normal paper when the comparison value is below the predefined reference value.

3. The printer for security paper of claim 1, further comprising:

a first optical sensor disposed on the printing paper feeding path, wherein the security paper sensor is disposed behind the first optical sensor on the printing paper feeding path, the first sensing value is a value sensed by the security paper sensor when the first optical sensor senses printing paper that has not been sensed on the printing paper feeding path, and the second sensing value is a value sensed by the security paper sensor for a certain period of time after the first optical sensor senses printing paper.

4. The printer for security paper of claim 3, wherein the distance between the first optical sensor and the security paper sensor is smaller than the distance between the first printing paper and the succeeding second printing paper on the feeding path.

5. The printer for security paper of claim 3, further comprising:

a second optical sensor disposed behind the security paper sensor on the printing paper feeding path, wherein the second sensing value is a value sensed by the security paper sensor until the second optical sensor senses printing paper.

6. An apparatus separately installable in a printer including a plurality of sensors provided on a printing paper feeding path for determining a position of the printing paper on the feeding path, a KCMY LED head or a laser scanner unit (LSU) and a printer engine controller for receiving signals from the plurality of sensors and transmitting a printing data to the KCMY LED head or the laser scanner unit (LSU), comprising:

a switch provided between the printer engine controller and the KCMY LED head or the laser scanner unit (LSU), for on/off switching a connection between the printer engine controller and the KCMY LED head or the laser scanner unit (LSU); and a controller configured to control the switch, based on its judgment, wherein the controller turns on the switch to connect the KCMY LED head or the laser scanner unit (LSU) to the printer engine controller so that the printing operation proceeds, or the controller turns off the switch to disconnect the KCMY LED head or the laser scanner unit (LSU) to the printer engine controller so that the printing operation does not proceed.

7. The apparatus separately installable in the printer of claim 6, further comprising:

a security paper sensor disposed on a printing paper feeding path;

wherein the controller determines whether printing paper on the feed path is security paper or normal paper, based on sensing values from the security paper sensor, wherein when printing paper is determined as security paper, the controller turns on the switch to connect the KCMY LED head or the laser scanner unit (LSU) to the printer engine controller so that the printing operation proceeds, and when printing paper is determined as normal paper, the controller turns off the switch to disconnect the KCMY LED head or the laser scanner unit (LSU) to the printer engine controller so that the printing operation does not proceed.

8. The apparatus separately installable in the printer of claim 7, wherein the controller compares a first sensing value sensed by the security paper sensor when printing paper to be determined is not present near the security paper sensor with one or more second sensing values sensed by the security paper sensor for the corresponding printing paper on the feeding path, during the course of conveying the corresponding printing paper on the feeding path, determining printing paper as security paper when a comparison value is above a predefined reference value, and determining printing paper as normal paper when the comparison value is below the predefined reference value.

* * * * *